Sept. 16, 1969 HIROSHI AOYAMA 3,467,870
AUTOMATIC FREQUENCY SWEEP APPARATUS
Filed Jan. 28, 1966
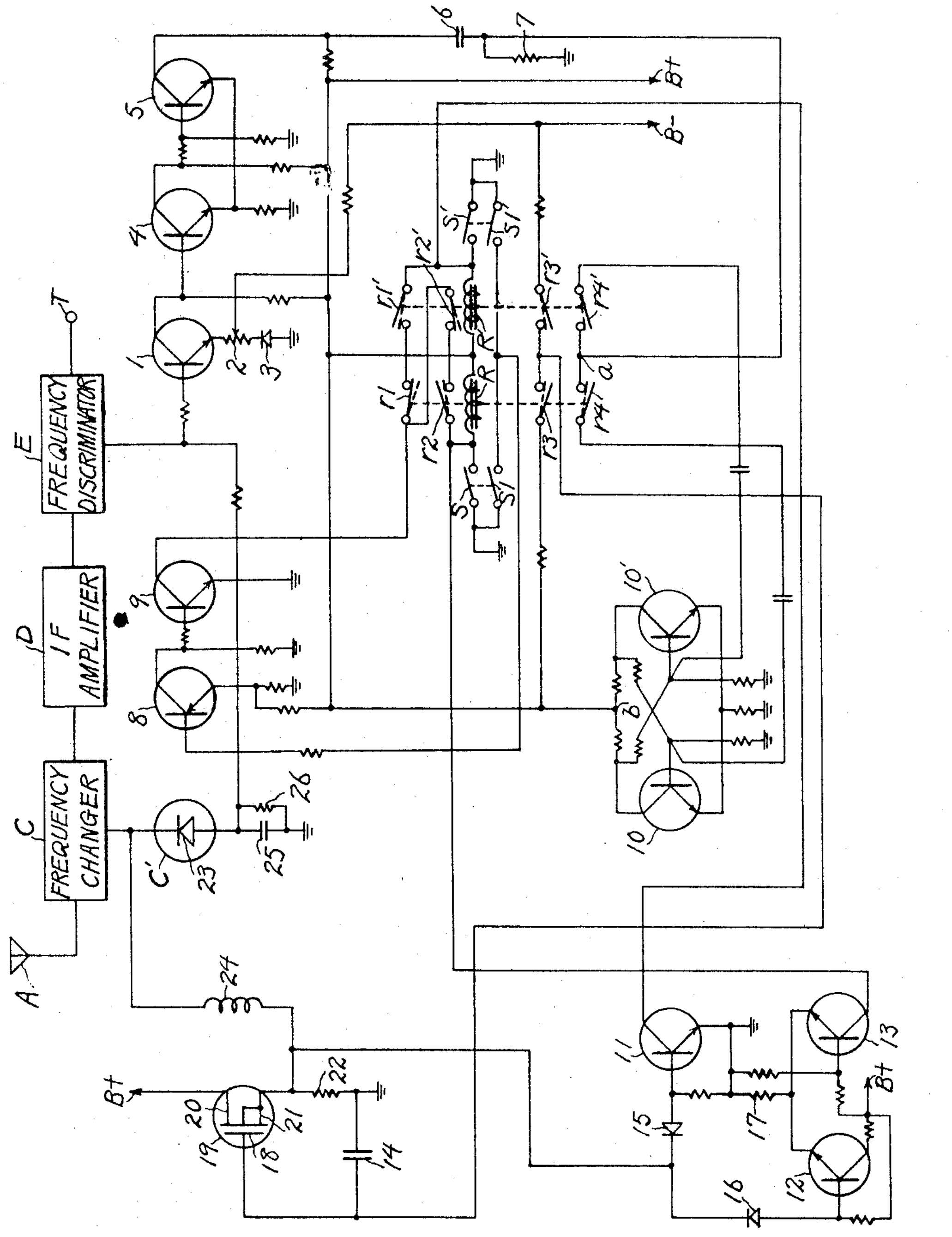
INVENTOR.
H. Aoyama
BY
Richards & Geier
ATTORNEYS United States Patent Office 3,467,870
Patented Sept. 16, 1969

3,467,870
AUTOMATIC FREQUENCY SWEEP APPARATUS

Hiroshi Aoyama, Kawasaki-shi, Japan, assignor to Trio Corporation, Tokyo, Japan, a limited-liability company of Japan Filed Jan. 28, 1966, Ser. No. 523,645
Claims priority, application Japan, Feb. 16, 1965, 40/11,758; Mar. 2, 1965, 40/12,026; Mar. 15, 1965, 40/14,965
Int. Cl. H04b *1/32*
U.S. Cl. 325—470 4 Claims

ABSTRACT OF THE DISCLOSURE

An automatic frequency sweep apparatus includes a pair of gang switches operating a pair of relays having interlocked contacts. A charge-and-discharge condenser is connected with the relays. A field effect transistor is inserted between the condenser and a capacity-variable diode of a frequency changer.

This invention relates to automatic station selecting radio receivers, and particularly to automatic frequency sweep apparatus thereof.

In automatic station selecting radio receivers, automatic frequency sweep apparatus, in which the bias of a capacity-variable diode in a frequency changer is changed by a charge-and-discharge condenser, are well known. However, in such apparatus exact tuning to the central frequency of the required signal can not be easily obtained, and such tuning can be hardly maintained for a long time, and moreover, a reciprocal frequency sweep can not easily take place.

The principal object of the invention is to remove such defects, and the chief features and advantages thereof are as follows:

(1) Exact tuning to the central frequency of the required signal can be easily obtained by inserting pulse generating means between a frequency discriminator and a relay circuit.

(2) Said tuning can be easily maintained for a long time by inserting a field effect transistor between a charge-and-discharge condenser and a capacity-variable diode.

(3) A reciprocal frequency sweep can easily take place by inserting a bias responsive circuit between said relay circuit and said charge-and-discharge condenser.

Other features and advantages will become apparent from the following description.

The sole figure of the accompanying drawing is a block and circuit diagram of an embodiment of the invention.

Referring to the figure, a low frequency signal such as sound is extracted at an output terminal T from high frequency waves received by an antenna A after passing through a frequency changer C, an intermediate frequency amplifier D and a frequency discriminator E.

Said discriminator is connected to the base of a DC amplifying transistor 1, the emitter of which is earthed through an adjustable resistor 2 and a diode 3, an adjusting contact of said resistor being connected to a DC source B—. Connected to the collector of the transistor 1 is a Schmidt circuit for producing rectangular waves, which consists of two transistors 4 and 5, each collector thereof being connected to the source B+ through a resistor. The collector of the transistor 5 is connected to a differentiation circuit for changing said rectangular waves to pulses, which consists of a condenser 6 and an earthed resistor 7, their connection being connected to a connection point *a* of contacts *r*4 and *r*4′ of relays R and R′, respectively. Said relays R and R′ are provided with interlocked contacts *r*1–*r*2–*r*3–*r*4 and *r*1′–*r*2′–*r*3′–*r*4′, respectively, and said relays are connected to the source B+ at each inner end and earthed through switches S and S′, respectively, at each outer end. Said switches S and S′ are interlocked with switches S1 and S1′, respectively, forming a pair of ganged switches which are preferably of push button type and serve to operate this apparatus.

Said switches S1 and S1′ are earthed at each outer end and connected to the base of a driver transistor 8 through a resistor at each inner end. The collector of said transistor is earthed through a resistor and connected to the base of a next stage emitter-earthed transistor 9 through a resistor in order to make a relay holding circuit. Namely, the collector of the transistor 9 is connected to the outer end of the contact *r*1; and the emitter of the transistor 8 is earthed through a resistor and connected to the source B+ through a resistor, to the outer end of the contact *r*3 and to a connection point *b* in a bistable multivibrator circuit consisting of a pair of transistors 10 and 10′.

The interlocked contacts *r*1–*r*2–*r*3–*r*4 and *r*1′–*r*2′–*r*3′–*r*4′ are arranged in four pairs and the contacts of each pair are connected in series. The outer end of the contact *r*1 is connected to that of the contact *r*2′; the outer end of the contact *r*1′ is connected to the outer end of the relay R′ and the collector of a transistor 11 in a bias responsive circuit which contains said transistor and two other transistors 12 and 13; the outer end of the contact *r*2 is connected to the outer end of the relay R and the collector of the transistor 13; each inner end of the contacts *r*3 and *r*3′ is connected to an earthed charge-and-discharge condenser 14 for sweep use, and the outer end of the contact *r*3′ is connected to the source B— through a resistor; and each outer end of the contacts *r*4 and *r*4′ is respectively connected to each base of the transistors 10 and 10′ through a DC stopping condenser.

In the multivibrator consisting of the transistors 10 and 10′ each base thereof is earthed through a resistor and connected to each collector of the opponent transistor through a resistor, each collector being connected to the connection point *b*, which is connected to the source B+, through a resistor, and each emitter of said transistors being earthed through a common resistor.

Further, in the bias responsive circuit containing the transistors 11, 12 and 13 each base of transistors 11 and 12 is respectively connected to the source of a field effect transistor, which is hereafter described, through a Zener diode 15 and an ordinary diode 16. The base of the emitter-earthed transistor 11 is also earthed through a resistor, and the base and collector of the transistor 12 as well as the base of the transistor 13 are connected to the source B+ through a respective resistor, said base of the transistor 13 being earthed through a resistor and each emitter of the transistors 12 and 13 being also earthed through a control resistor 17.

Connected to the condenser 14 is the gate of the field effect transistor 19 having a very high input impedance, the drain 20 of which is connected to the source B+, the source 21 of said transistor being earthed through a resistor 22 and connected to a frequency changing part C′ having a capacity-variable diode 23 of the frequency changer C through a high frequency stopping coil 24. The opposite end of said diode is earthed through an AFC circuit consisting of a condenser 25 and a resistor 26 in parallel, the connection of said condenser and resistor as well as said diode being connected to the connection of the discriminator E and the transistor 1 through a resistor.

The embodiment of the invention is thus constructed and its operation is as follows:

High frequency waves received by the antenna A and reaching frequency discriminator E after passing through the frequency changer C and the intermediate frequency amplifier D is amplified by the DC amplifying transistor 1 and changed to positive or negative pulses according to the characteristic of said discriminator by the Schmidt circuit consisting of the transistors 4 and 5 as well as the differentiation circuit consisting of the condenser 6 and the resistor 7.

When the ganged switch S–S1 is temporarily closed, the relay R is energized by the DC source B+ to move the contacts *r*1, *r*2, *r*3 and *r*4 to new positions indicated by dotted lines from the old positions shown in full lines, and the collector of the transistor 10′ of the bistable multivibrator is earthed to become active; then current flows to the base of the driver transistor 8 in the relay holding circuit to activate it, and amplified collector current of the next stage transistor 9 flows through the relay R, the closed contacts *r*2, *r*2′ and the opened contact *r*1, thereby holding said relay active although the gang switch S–S1 is opened.

Through the closed contact *r*3 the charge-and-discharge condenser 14 is gradually charged by the source B+, and its positive terminal voltage, namely the gate potential of the field effect transistor 19 gradually rises, and accordingly its source current gradually increases, thereby gradually increasing the voltage drop of the load resistor 22 and the bias of the capacity-variable diode 23 of the frequency changing part C′; thus frequency sweep takes place in the direction of higher frequency from a lower one.

During this frequency sweep, in the neighborhood of the central frequency to be tuned, negative pulses from the differentiation circuit composed of elements 6 and 7 are applied to the base of the cut-off transistor 10 through the closed contact *r*4, and said transistor remains inactive. However, when the frequency changing part C′ is tuned to said central frequency, namely the frequency at the center of the characteristic curve of the frequency discriminator E, positive pulses from said differentiation circuit are applied to the base of the transistor 10 to activate it, whereby the opponent transistor 10′ becomes inactive, and also the transistors 8 and 9 become inactive, thus deenergizing the relay R to restore its contacts to the old positions. Due to the opening of the contact *r*3 the condenser 14 is no longer charged, and it hardly discharges towards the field effect transistor 19 due to the very high input impedance thereof, and accordingly its source potential and the bias of the diode 23 are kept nearly constant. Thus exact tuning to the required central frequency is obtained and maintained for a long time.

Further, when the gang switch S–S1 is again temporarily closed, the same frequency sweep in the direction of higher frequency from a lower one takes place as above mentioned, and the condenser 14 is further charged.

In case that there is no tuning frequency in said direction and the positive terminal voltage of said condenser exceeds the highest normal value corresponding to the highest tuning frequency, the Zener diode 15 in the bias responsive circuit suddenly leads current to the base of the transistor 11 to activate it, whereby its collector current energizes the relay R′ to move the contacts *r*1′, *r*2′, *r*3′ and *r*4′ to dotted line positions. Then the collector current of the transistor 9 flowing through the relay R is interrupted by the opening of the contact *r*2′, whereby said relay is deenergized to restore its contacts to the old positions, and the condenser 14 discharges towards the source B— through the closed contact *r*3′. Thus the positive terminal voltage of said condenser and the bias of the diode 23 lower, and accordingly the frequency sweep is automatically reversed and takes place in the direction of lower frequency from a higher one.

When the positive terminal voltage of the condenser 14 drops below the above stated normal value, the Zener diode 15 interrupts the current flowing to the base of the transistor 11 to become inactive and its collector current does not flow. But by the closing of the contact *r*1′ the collector current of the active transistor 9 flows through the relay R′ to hold it energized; thus said condenser gradually discharges and the frequency sweep in the direction of lower frequency from a higher one is maintained.

During this return sweep, in the neighborhood of the central frequency to be tuned, positive pulses from the differentiation circuit 6, 7 are applied to the base of the active transistor 10′ through the closed contact *r*4′, and said transistor remains active. However, when the frequency changing part C′ is tuned to said central frequency, namely the frequency at the center of the characteristic curve of the discriminator E, negative pulses from said differentiation circuit are applied to the base of the transistor 10′ to make it inactive, whereby the opponent transistor 10 becomes active, and also the transistors 8 and 9 become inactive, thus deenergizing the relay R′ to restore its contacts to the old positions. Due to the opening of the contact *r*3′ the condenser 14 no longer discharges, and as above mentioned the bias of the diode 23 is kept nearly constant. Thus exact tuning to the required central frequency is obtained and maintained for a long time.

Further, when the ganged switch S′–S1′ is temporarily closed, the same frequency sweep in the direction of lower frequency from a higher one takes place as easily seen, and said condenser further discharges.

In case that there is no tuning frequency in said direction and the positive terminal voltage of the condenser 14 drops below the lowest normal value corresponding to the lowest tuning frequency, the ordinary diode 16 in the bias responsive circuit leads current from the base of the active transistor 12 to become inactive, whereby the cut-off transistor 13 becomes active and its collector current energizes the relay R to move the contacts *r*1, *r*2, *r*3 and *r*4 to the dotted line positions. Then by the closing of the contact *r*3 the condenser 14 is again charged by the source B+, and the frequency sweep is automatically reversed, namely it takes place in the direction of higher frequency from a lower one.

When the positive terminal voltage of said condenser exceeds said normal value, the diode 16 interrupts the current from the base of the cut-off transistor 12 to activate it and to make the active transistor 13 inactive again.

What I claim is:

1. An automatic frequency sweep apparatus comprising two ganged switches having contacts, two relays interconnected in series and having opposed ends connected with said contacts, whereby each of said ganged switches operates a separate relay, two contacts interconnected in series, separate switches operatively connected with said relays and adapted to engage separately the second-mentioned contacts, a charge-and-discharge condenser having a plate connected with the second-mentioned contacts, a field effect transistor having its gate connected to said plate of the condenser, means connecting the source of said field effect transistor to the other plate of said condenser, a frequency changer, a capacity-variable diode, a conductor connecting said frequency changer with said diode and means connecting said conductor with the source of said field effect transistor.

2. An automatic frequency sweep apparatus comprising two ganged switches having contacts, two relays interconnected in series and having opposed ends connected with said contacts, whereby each of said ganged switches operates a separate relay, two contacts interconnected in series, separate switches operatively connected with said relays and adapted to engage separately the second-mentioned contacts, a charge-and-discharge condenser having a plate connected with the second-mentioned contacts, a frequency changer, a capacity-variable diode, a conductor connecting said frequency changer with said diode, means connecting said conductor with the other plate of said condenser, a bias responsive circuit having two transistors, the emitter electrodes of said two transistors being interconnected, a third transistor, means connecting the base electrode of the third transistor with the base electrode of one of said two transistors, means connecting the first-mentioned means with the second-mentioned means, a conductor connecting the collector electrode of one of said two transistors with one of the second-mentioned contacts and a conductor connecting the collector electrode of the other one of said two transistors with the other one of the second-mentioned contacts.

3. An automatic frequency sweep apparatus comprising two ganged switches having contacts, two relays interconnected in series and having opposed ends connected with said contacts, two contacts interconnected in series, separate switches operatively connected with said relays and adapted to engage separately the second-mentioned contacts, a bistable multivibrator having two transistors, the emitter electrodes of said two transistors being interconnected, a conductor connecting the base electrode of one of said two transistors with one of the second-mentioned contacts, a conductor connecting the base electrode of the other one of said two transistors with the other one of the second-mentioned contacts, whereby each of the two ganged switches individually operates both a corresponding relay and the multivibrator, a frequency discriminator, pulse generating means comprising a condenser, means connecting said frequency discriminator with one plate of said condenser, a conductor connecting said means with said opposed ends of the relays, a conductor connecting the other plate of said condenser with the second-mentioned contacts, a frequency changer, a capacity-variable diode, a conductor connecting said frequency changer with said diode, means connecting the last-mentioned conductor with the second-mentioned contacts, and means connecting said frequency changer with said frequency discriminator.

4. An automatic frequency sweep apparatus comprising two ganged switches having contacts, two relays interconnected in series and having opposed ends connected with said contacts, two contacts interconnected in series, separate switches operatively connected with said relays and adapted to engage separately the second-mentioned contacts, a bistable multivibrator having two transistors, the emitter electrodes of said two transistors being interconnected, a conductor connecting the base electrode of one of said two transistors with one of the second-mentioned contacts, a conductor connecting the base electrode of the other one of said two transistors with the other one of the second-mentioned contacts, whereby each of the two ganged switches individually operates both a corresponding relay and the multivibrator, a frequency discriminator, pulse generating means comprising a condenser, means connecting said frequency discriminator with one plate of said condenser, a conductor connecting said means with said opposed ends of the relays, a conductor connecting the other plate of said condenser with the second-mentioned contacts, a charge-and-discharge condenser having a plate connected with the second-mentioned contacts, a frequency changer, a field effect transistor having its gate electrode connected to said plate of the charge-and-discharge condenser, means connecting the source electrode of said field effect transistor to the other plate of said charge-and-discharge condenser, a bias responsive circuit having two transistors, the emitter electrodes of said two transistors being interconnected, a third transistor, means connecting the base electrode of the third transistor with the base electrode of one of said two transistors, a capacity-variable diode, a conductor connecting said frequency changer with said diode, means connecting the last-mentioned conductor with the source of said field effect transistor, means connecting the last-mentioned means to the other plate of said charge-and-discharge condenser, means connecting the last-mentioned means with the base electrode of the third transistor of the bias responsive circuit, a conductor connecting the collector electrode of one of the two first-mentioned transistors of the bias responsive circuit with one of the second-mentioned contacts, a conductor connecting the collector electrode of the other one of the two first-mentioned transistors of the bias responsive circuit with the other one of the second-mentioned contacts, and means connecting said frequency changer with said frequency discriminator.

References Cited

UNITED STATES PATENTS

| | | | |
|---|---|---|---|
| 3,024,359 | 3/1962 | Birx | 325—470 |
| 3,189,829 | 6/1965 | Bento | 325—470 |

KATHLEEN H. CLAFFY, Primary Examiner

B. P. SMITH, Assistant Examiner